United States Patent [19]

Koyama

[11] Patent Number: 4,882,237
[45] Date of Patent: Nov. 21, 1989

[54] ALUMINUM-CERAMIC COMPLEX MATERIAL

[75] Inventor: Mamoru Koyama, Fujiitera, Japan

[73] Assignee: Tokyo Metal Co., Ltd., Japan

[21] Appl. No.: 167,571

[22] Filed: Mar. 14, 1988

[30] Foreign Application Priority Data

Mar. 18, 1987 [JP] Japan ................... 62-65489

[51] Int. Cl.$^4$ ............ B32B 15/04; B32B 15/20; C04B 35/10
[52] U.S. Cl. .................. 428/699; 428/701; 428/702; 501/127
[58] Field of Search .................. 501/127, 153; 428/471.2, 469, 697, 699, 701, 702

[56] References Cited

U.S. PATENT DOCUMENTS

| | | | |
|---|---|---|---|
| 2,047,029 | 7/1936 | Müller | 428/697 |
| 2,475,469 | 7/1949 | Bennett et al. | 428/697 |
| 2,757,105 | 7/1956 | Terry | 428/697 |
| 2,843,507 | 7/1958 | Long | 501/127 |
| 3,540,862 | 9/1965 | Roemer | 428/697 |
| 4,753,854 | 6/1988 | Gavrilov et al. | 428/697 |

Primary Examiner—William R. Dixon, Jr.
Assistant Examiner—David M. Brunsman
Attorney, Agent, or Firm—Darby & Darby

[57] ABSTRACT

This invention relates to an aluminum-ceramic complex material wherein a ceramic layer is formed by allowing a copper compound to react with an aluminum oxide on an aluminum surface. The resulting complex material exhibits a high harndess together with excellent adhesive strength, bendability and heat and wear resistance.

11 Claims, 1 Drawing Sheet (1) Anodic oxidation treatment

Alumite layer $Al_2O_3 + Al(OH)_2$
— $Al$ or $Al$ alloy (2) Ceramic material coating Ceramic material coating (paste) Cu compound + organic solvent
— $Al_2O_3 + Al(OH)_2$
— $Al$ or $Al$ alloy (3) After heat treatment Ceramic material $Cu_xAl_2O_3 + CuO + Al_2O_3$
Alumite $Al_2O_3$
Metal base $Al$ or $Al$ alloy

ALUMINUM-CERAMIC COMPLEX MATERIAL

This invention relates to a stratified aluminum-ceramic complex material and a method of making that material. The complex material, according to the invention, comprises a ceramic surface layer integrally bonded to an aluminum or aluminum alloy substrate through an intermediate aluminum oxide layer. The material is obtained by anodic oxidation of the substrate to form an aluminum oxide layer, surface application of at least one ceramic reactant to the aluminum oxide layer, and heat treatment of the substrate and its associated layers to obtain the final complex product. The ceramic reactants contain copper, and are organometallic and/or halogen compounds dispersed in an organic solvent, such as glycerine.

BACKGROUND OF THE INVENTION

Aluminum metal is one of the most widely used materials in many fields of industry because of its excellent characteristics, such as good workability and light weight. Aluminum may be used in its pure form (approximately 99% elemental aluminum) as extracted from natural mineral sources (such as bauxite), but more often is used as an alloy with one or more other earth metals, such as copper, silicon, magnesium, manganese, nickel or zinc. An alloy is a uniform mixture or combination of metals or metallic compounds, but is not itself a compound. The mixture can be a solid solution, can contain mutually insoluble metals, and can form a crystal lattice, and the resulting alloy will usually have physical characteristics that differ from those of its component metals.

Because of insufficient wear resistance and corrosiveness (due to softness and oxidizability) aluminum and aluminum alloys are often subjected to a variety of surface treatments. Typical examples of surface treatments for aluminum metal are anodic oxidation, vacuum deposition, electroplating, surface coating, cladding and spraying.

Anodic oxidation of aluminum is an electrochemical process in which aluminum is anodically oxidized in an aqueous electrolyte to form an aluminum oxide (alumina, or $Al_2O_3$) on its surface. In vacuum deposition, a metal is vacuum-deposited on the surface of the aluminum. Electroplating provides that the aluminum surface is first zinc-coated (a zincate treatment) or nickel-coated and then electroplated with a predetermined metal. Electroless plating and synthetic resin coatingtreatments may be used, in which an aluminum surface is coated with synthetic resin. Cladding is a method wherein an aluminum surface is cladded with thin copper sheeting by an applied organic adhesive. There is also a process in which the aluminum surface is sprayed with another metal or ceramic.

Anodic oxidation is of particular interest in the present invention. When an aluminum substrate is made the anode in an electrolytic circuit, negatively charged anions are moved toward the anode and discharged. In an aqueous electrolytic solution, some of the anions are oxygen, which forms a chemical bond with the aluminum anode to form aluminum oxide. The oxidation reaction is affected by various treatment conditions, such as the properties of the electrolyte, the temperature, current, voltage, treatment time, etc. In most applications, anodic oxidation requires some form of pretreatment of the substrate, such as mechanical treatment (e.g., sand-blasting), chemical treatment (e.g., dipping in caustic soda) or electrical treatment (e.g. electrolytic degreasing).

Additional factual background concerning aluminum, its alloys and anodic oxidation can be found in Van Nostrand's Scientific Encyclopedia, Van Nostrand's Chemical Dictionary, and in the Kirk-Othmer Concise Encyclopedia of Chemical Terminology, at entries for aluminum, anodic oxidation, alloy, metal treatments, and welding.

The known treatments for aluminum and its alloys have many disadvantages. For example, while anodically oxidized aluminum is used in quite a few fields, its hardness does not necessarily meet the requirements of some applications, and its wear resistance may be insufficient. For example, micropores in the oxidized anodic coating may result in poor resistance to corrosion. The vacuum deposition treatment is expensive and impracticable for bulky materials and mass-production. Electroplating is widely used, but due to the high ionization of the aluminum itself, it is difficult to plate copper directly onto aluminum. In general, therefore, zinc and nickel are first electroplated on aluminum as undercoats and copper or chrome is thereafter plated as another layer. This method involves extra steps, such as troublesome pretreatments (e.g. degreasing), and suffers from various disadvantages. For example, electroplated metals are insufficiently stable as adhesives on an aluminum substrate.

Cladded materials are complex and use adhesives in most cases, resulting in heat resistance problems. During a heat cycle (alternating increasing and decreasing temperature), differences in the expansion coefficient between aluminum and the coating metal cause a flaking phenomenon. Similarly, metal spraying treatment (for spray coatings) entails severe problems in adhesive strength; for example, a sprayed ceramic cannot endure any secondary working or mechanical deformation, such as bending.

Background material concerning the general behavior of ceramic materials can be found in Frankel, J., Z: phys 35 652 (1926) and C. Wagner and W. Schotzky, Z: phys B.11 (1931).

Ceramic materials containing copper and alumina are known as Spinel ceramics, and can be represented by the formula $Cu_xAl_2O_3$, where x is an integer. These materials are not well understood, and have not been known to be useful as surface treatments for aluminum substrates. Successful and integrally formed complex aluminum-copper-ceramic materials having a desirable laminar structure and a homogeneous surface layer were not known prior to this invention, nor were the benefits of the structure and method of the invention heretofore predicted.

SUMMARY OF THE INVENTION

It is an object of this invention to provide a high quality aluminum-ceramic complex material, in which an aluminum substrate is provided with a ceramic surface that does not suffer from the weaknesses of known surface treatments.

According to the invention, an aluminum oxide layer is formed on the surface of a substrate containing aluminum, followed by a coating with a ceramic compound including copper. By subjecting this combination to a predetermined heat treatment, a copper-aluminum system ceramic is uniformly formed on the aluminum surface through the intervening aluminum oxide layer.

Unlike other ceramic surface treatments, which depend on adhesion of adjacent materials, the present invention provides an integral (chemically bonded) layer, which forms a stratified aluminum-ceramic complex material in combination with the substrate and an intermediate aluminum oxide layer.

DETAILED DESCRIPTION OF THE INVENTION

This invention relates to a complex material, wherein an aluminum oxide layer is formed on an aluminum surface, a compound including copper is applied to the aluminum oxide layer, and a copper-aluminum system ceramic, or spinel ceramic is formed on the aluminum surface by applying a heat treatment.

As a starting material for the complex material, a substrate containing aluminum is provided. Preferably, the substrate is pure aluminum or an alloy of aluminum. The substrate may be of any desired thickness, the only requirement being that the substrate is capable of anodic oxidation of aluminum, to form aluminum oxide (alumina, $Al_2O_3$) on at least one surface.

Figure 1:
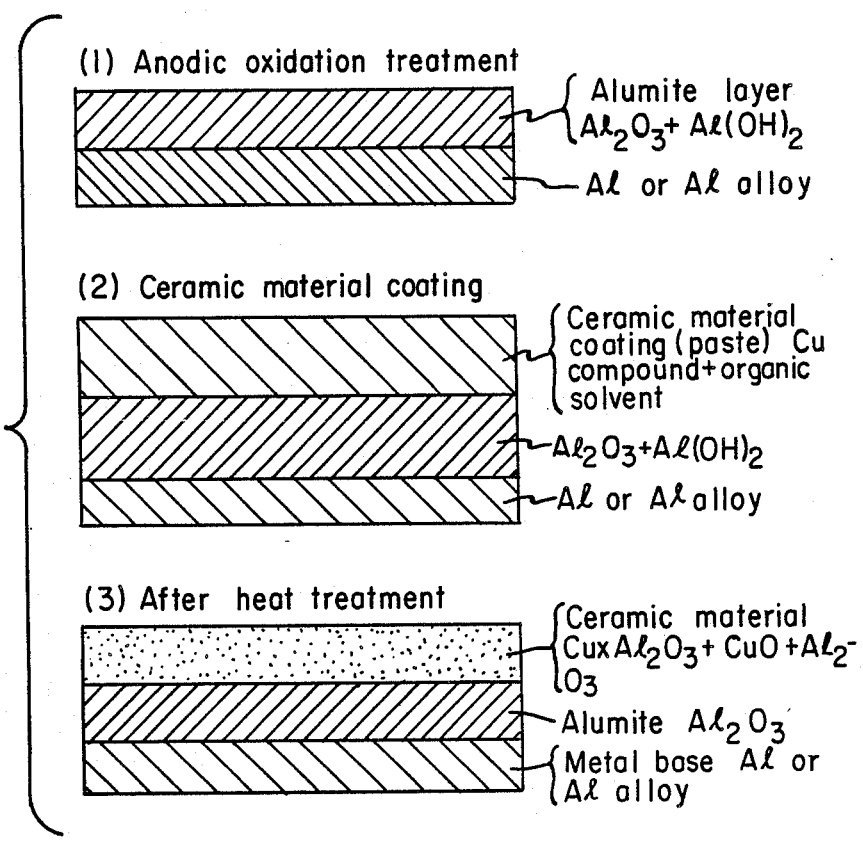
FIG. 1 is a schematic diagram of a process according to the invention, showing Phases (1) (2) and (3) in the stepwise formation of the composite material.

As shown in step (1) of FIG. 1, the substrate is anodically oxidized according to a known method, as summarized above. The resulting alumina layer formed on the substrate surface may be from 10 to 100 um thick, but preferably ranges from 10 to 30 um.

According to the invention, at least one compound containing copper is applied over the substrate and its alumina layer as an outer layer or laminate. See, Fig. Step (1) of FIG. 1. The compound reacts with aluminum through the intervening alumina layer to form a complex aluminum-copper-ceramic material. The resulting complex material overcomes many of the defects of conventional surface treatments or other complex materials.

The compound containing copper is preferably applied in the form of a paste and comprises at least one of an organometallic compound of copper (such as an alkoxide) and a copper halide compound (such as a fluoride or chloride) dispersed in an organic solvent (preferably glycerine). Other suitable solvents include paraffin and oils. Copper sulphate can also be used as a copper-containing compound. The paste may be applied by any conventional means, such as by spraying or brushing. When a halide is used, it should preferably have a Shotzky disorder, which is a structural defect which results in the formation of two "empty hole" lattice structures, one anodic and the other cathodic. Preferably, both the organometallic and halide compounds are used, because the halide tends to activate the aluminum surface as a halogen intermediate, thereby promoting the reaction between the organometallic compound and the aluminum substrate.

The paste is formed as a uniform solid mixture of micropowders of pulverized copper-containing compound which are combined in an organic solvent. This mixture is kneaded until its uniformity is assured, with finer powders generally providing better results.

In a preferred embodiment, the composition of the copper paste is as follows, in proportion by weight:

| | |
|---|---|
| copper alkoxide | 5 |
| a first copper chloride | 1 |
| a second copper chloride | 3 |
| glycerine | 0.5 |
| paraffin | 0.5 |

After the paste is applied to the alumina layer on the substrate, a heat treatment is applied. The combination of substrate, alumina layer and paste are heated to a temperature of from 300 to 600 degrees C for aluminum alloy and from 450 to 500 degrees C for pure aluminum, according to a known means. The heat treatment is believed to result in an oxidation reaction, which can be accelerated by providing oxygen gas ($O_2$) in an atmospheric gas, such as $N_2$-$O_2$, 15%).

The heat treatment results in the formation of a surface layer of ceramic material that is intimately associated with the underlying aluminum substrate through the intermediate alumina layer. The final product is a new and useful stratified complex alumina-copper-ceramic material. See, Step (3) of FIG. 1.

Because the surface layer is ceramic, it has a high hardness and some flexibility in response with the substrate. It also has excellent resistance against wear, corrosion, and heat. Because it is integrally bonded to the substrate as part of a stratified complex material, the ceramic layer will not separate from the substrate under stress, as experience with other surface treatments. Accordingly, the material can be used widely and advantageously for electronic materials such as IC substrates, for kitchen utensils, as well as for building materials.

The invention is further described according to the following example, which is illustrative, and does not serve to limit the scope of the invention or the accompanying claims.

EXAMPLE.

Aluminum material having a purity of 99% or more, was anodically oxidized under the following conditions.
Electrolyte sulfuric acid 20%
aluminum sulphate 25g/dm$^3$
Temperature of solution 20° C.
Voltage 15V
Current density 2.2 A/dm$^2$
A surface layer of alumina having a thickness of 25um was formed under these conditions.

Micropowders of copper alkoxide were uniformly applied to the alumina layer of the aluminum substrate. This composition was heat-treated at 510° C.±10° C. for 10 minutes, after which it was then kept in the atmosphere.

After heat-treatment, a black ceramic remains after removing a reaction residue from the surface.

Evaluation of the resulting product revealed that adhesive strength is excellent and the coating does not cause any flaking because an integral layer has been formed. In theory, the surface layer is formed by diffusion and ionic bonding. The coating will not cause any crack even if subjected to bending. As for surface hardness, a hardness gained by alumina-treatment is about Hvc 200 (micro-Vickers) and even by a high hardness coating method it is about 450 at most. On the contrary, this invention can provide a hardness (Hv) more than 500 because of the formation of the ceramic complex. These results are summarized in Table I, below.

TABLE I
EVALUATION OF COMPOSITE ALUMINUM CERAMIC MATERIAL

| | Alumina | Copper plating | Spray (alumina) | Present Invention |
|---|---|---|---|---|
| Adhesive strength | e | g | p | e |
| Hardness | 200 | 220 | more than 500 | more than 500 |
| Bendability | g | f | f | e |
| Heat Cycle | g | f | f | e |
| Heat resistance (20% HCl) | p | p | f | e |

Note e —excellent; g —good; f —fair; p —poor

Adhesive strength (or bonding strength) is evaluated by securing a sample of the composite material to a clamping pedestal and repeatedly bending the sample through an angle of 90 degrees, until breakage occurs. The adhesive strength is proportional to the number of bilateral bends needed to cause separation.

Hardness (Hv) is tested by pressure from a constant load diamond, and is proportional to the surface area of the hollow depression caused by the diamond. When the surface area is large (a wide depression) the material is soft. When the diamond produces only a small depression (a small surface area) the material is hard.

Bending strength (or bendability) is evaluated by checking for cracks when a sample of the composite material is bent once along an edge and around a corner, through a predetermined angle R, usually 90 degrees.

Heat cycle tests are conducted by checking for variations in sample integrity (such as separation of the ceramic layer), when samples are alternately heated and cooled between room temperature and 200 degrees C.

Thermal stability is assessed by dropping a solution of 20% HCl onto the sample, which is maintained at 60 degrees C in a constant temperature oven for one hour. The sample is then checked for corrosion and discoloration.

Figure 2:
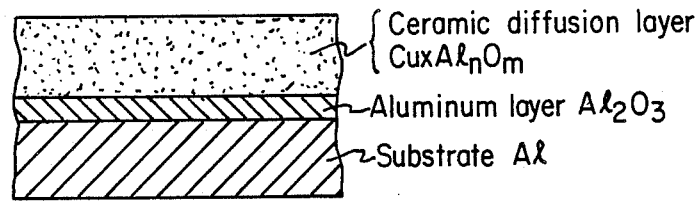
FIG. 2 represents a microscopic view of a composition according to the invention.
Figure 3:
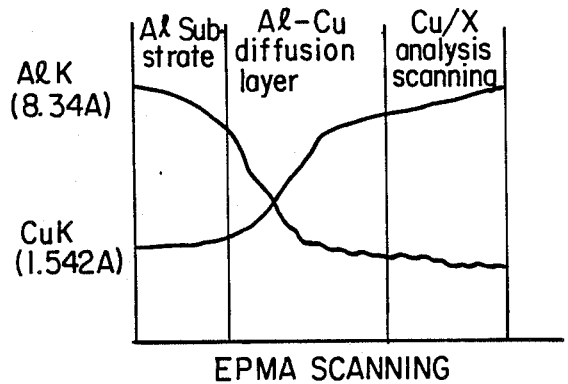
FIG. 3 shows an EPMA graph for a representative cross section of a complex material embodying the invention.

Referring to FIG. 2, the composite material of the invention exhibits a copper-ceramic diffusion layer comprising the aluminum and ceramic layers bonded to the substrate in a stratified composite structure. This structure is also shown by examination with an Electron Probe Micro-Analyzer (EPMA), FIG. 3. The EPMA scan of the composite according to the invention, shows a sectional view, in um, in which the x axis represents the scanning direction from the surface moving to the inside of the sample.

Without relying on any particular theory, it is believed that the composite material of the invention is formed by diffusion of elemental copper from the surface layer of paste into the alumina layer, and by the formation of copper oxides on the outermost layer as a result of the heat treatment. This forms a new outer composite layer (a ceramic diffusion layer) containing copper, and copper and aluminum oxides. Thus, the intermediate alumina layer is narrower after the reaction. See, FIGS. 1 and 2. The resulting composite structure is believed to involve the migration of copper atoms within the underlying solid alumina layer, according to principles of solid-solution chemistry.

Several mechanisms have been offered to explain the movement of atoms from one lattice point to another in a solid. According to a so-called "ring mechanism," the atoms switch positions with other adjacent atoms, meaning that the atoms experience physical rotation with respect to each other, probably under the influence of ionic forces.

In a crystalline solid there are lattice points within the structure that define the relative positions of atoms. When atoms migrate or diffuse through the crystal, they move either from lattice point to lattice point, or through gaps or interstices within the lattice structure. This type of motion is called a "hole mechanism", and can be envisioned as something like the slow movement of a fluid through a maze-like filter, or water diffusing through a sponge. The diffusion rate depends on the density of the material and the relative ease with which atoms can move from one lattice point to another. A similar mechanism is the self-interstitial mechanism.

It is believed that the composition of the invention occurs according to the hole mechanism or the self-interstitial mechanism, or some combination of the two.

When the heat treatment is applied to the aluminum substrate and its coating or transition layer of copper paste, a surface reaction is believed to occur in which copper and aluminum reactants diffuse or migrate to form a spinel ceramic coating that is integrally (ionically) bonded to the substrate. The result is a complex aluminum-copper ceramic material. The ceramic reactant is believed to be in the form of a metallic salt prior to the heat treatment, and the heat treatment is believed to promote an oxidation-type reaction. In theory the use of an organic solvent permits smooth application of the paste and promotes a homogeneous surface. The halide compound is believed to be particularly effective in promoting migration of copper at the interface with the alumina layer. When an alkoxide compound is used, the organic component evaporates during the heat treatment.

What is claimed is:

1. A layered aluminum-ceramic complex material comprising
a substrate layer containing aluminum,
an anodically induced aluminum oxidation layer covering said substrate layer,, and
a unified copper ceramic surface layer integrally bonded to and covering said aluminum oxidation layer,
said copper ceramic surface layer being formed by contacting said aluminum oxidation layer with an applied transition layer containing copper at a temperature sufficient to convert said applied transition layer to said ceramic surface layer.

2. An aluminum-ceramic complex material according to claim 1, wherein said copper ceramic surface layer is formed by diffusion between said aluminum oxide layer and said applied transition layer.

3. An aluminum-ceramic complex material according to claim 1, wherein said applied transition layer containing copper includes at least one of the group consisting of a copper halide, copper sulfate and copper alkoxide.

4. An aluminum-ceramic complex material according to claim 3, wherein said copper halide is at least one of copper chloride and copper fluoride.

5. An aluminum-ceramic complex according to claim 3, wherein said applied transition layer containing copper includes a copper halide and a copper alkoxide.

6. An aluminum-ceramic complex according to claim 1, wherein said applied transition layer containing copper additionally comprises an organic solvent.

7. An aluminum-ceramic complex according to claim 1, wherein said applied transition layer containing copper comprises a copper halide, a copper alkoxide, and an organic solvent.

8. An aluminum-ceramic complex according to claim 1, wherein said copper ceramic surface layer comprises a spinel ceramic.

9. An aluminum-ceramic complex according to claim 1, wherein said applied transition layer containing copper comprises a copper alkoxide, a copper chloride, and at least one of glycerine and paraffin.

10. A layered aluminum-ceramic complex material comprising
   a substrate layer containing aluminum,
   an anodically induced aluminum oxidation layer covering said substrate layer, and
   a unified spinel ceramic surface layer containing copper and integrally bonded to and covering said aluminum oxidation layer,
   said spinel ceramic surface layer being formed at a temperature sufficient to convert said applied transition layer to said ceramic surface layer and in the presence of an organic solvent as the diffusion product of said aluminum oxidation layer and an applied transition layer containing copper.

11. A layered aluminum-ceramic complex material as in claim 10, wherein said applied transition layer containing copper includes at least one of the group consisting of a copper halide, copper sulfate and copper alkoxide, and said organic solvent includes at least one of glycerine and paraffin.

* * * * *